United States Patent
Singnurkar

(10) Patent No.: US 8,405,452 B2
(45) Date of Patent: Mar. 26, 2013

(54) FILTERING ARRANGEMENT, FILTERING METHOD AND CURRENT SENSING ARRANGEMENT

(75) Inventor: Pramod Singnurkar, Graz (AT)

(73) Assignee: austriamicrosystems AG, Unterpremstaetten (AT)

( * ) Notice: Subject to any disclaimer, the term of this patent is extended or adjusted under 35 U.S.C. 154(b) by 0 days.

(21) Appl. No.: 12/746,369

(22) PCT Filed: Nov. 14, 2008

(86) PCT No.: PCT/EP2008/065574
§ 371 (c)(1),
(2), (4) Date: Aug. 24, 2010

(87) PCT Pub. No.: WO2009/071430
PCT Pub. Date: Jun. 11, 2009

(65) Prior Publication Data
US 2010/0308903 A1    Dec. 9, 2010

(30) Foreign Application Priority Data
Dec. 4, 2007 (EP) .................................. 07023475

(51) Int. Cl.
*H03K 5/00* (2006.01)
(52) U.S. Cl. ..................................... 327/552; 327/362
(58) Field of Classification Search .......... 327/551–559, 327/336–337, 362
See application file for complete search history.

(56) References Cited

U.S. PATENT DOCUMENTS

| | | | |
|---|---|---|---|
| 5,266,852 A | * | 11/1993 | Shigenari et al. ............. 327/552 |
| 7,030,688 B2 | * | 4/2006 | Dosho et al. ................. 327/558 |
| 7,466,175 B2 | * | 12/2008 | Smith et al. .................... 327/156 |
| 2002/0158615 A1 | | 10/2002 | Goodfellow et al. |
| 2007/0139839 A1 | | 6/2007 | Yoshihara |

FOREIGN PATENT DOCUMENTS

| | | |
|---|---|---|
| EP | 1 381 060 | 1/2004 |
| FR | 2 699 341 | 6/1994 |
| WO | WO 2007/050961 | 5/2007 |

* cited by examiner

*Primary Examiner* — Dinh T. Le
(74) *Attorney, Agent, or Firm* — Cozen O'Connor

(57) ABSTRACT

A filtering arrangement comprises a reference voltage input (1) and a compensation current arrangement (10) coupled to the reference voltage input (1) and configured to provide a control current at a current output (2) as a function of a voltage at the reference voltage input (1). The filtering arrangement also comprises a first and a second current source (20, 30) each having a control input (4, 5) coupled to the current output (2), a first and a second filter input (7, 8), and a first transistor (T1) and a second transistor (T2). The first transistor (T1) has a first connection (T11), a second connection (T12) and a control connection (T1c), where its first connection (T11) is coupled to the first current source (20) and its second connection (T12) is coupled to the first filter input (7) through a first resistor (R1). The second transistor (T2) has a first connection (T21), a second connection (T22) and a control connection (T2c), where its first connection T21) is coupled to the second current source (30), its second connection (T22) is coupled to the second filter input (8) through a second resistor (R2) and its control connection (T2c) is coupled to its first connection (T21) and to the control connection (T1c) of the first transistor (T1). A capacitive element (C1) is coupled between the first connection (T11) of the first transistor (T1) and the second connection (T22) of the second transistor (T2) and a filter output (6) is coupled to the first connection (T11) of the first transistor (T1).

13 Claims, 2 Drawing Sheets

FILTERING ARRANGEMENT, FILTERING METHOD AND CURRENT SENSING ARRANGEMENT

RELATED APPLICATION

This is a U.S. National Phase Application under 35 USC §371 of International Application PCT/EP2008/065574 filed on Nov. 14, 2008.

This patent application claims the priority of European Patent Application No. 07023475.2 filed Dec. 4, 2007, the disclosure content of which is hereby incorporated by reference.

FIELD OF THE INVENTION

The invention relates to a filtering arrangement and a filtering method. The invention further relates to a current sensing arrangement.

BACKGROUND OF THE INVENTION

A filtering arrangement comprises a low pass, a band pass or a high pass filter, configured to process input signals according to a certain cut-off frequency. Current sensing arrangements, widely used in DC/DC converters, usually comprise such a filtering arrangement for processing the input signals.

The presence of a filtering arrangement in a current sensing arrangement allows the elimination of peak overshoots of the input signal and the avoidance of unwanted triggering, caused by these peak overshoots. Usually such filtering arrangements are not built on-chip because of the size of certain elements such as the filter capacitor. Furthermore, the cut-off frequency or other filter characteristics of the filtering arrangement might change over time because of process variations within the filtering arrangement.

SUMMARY OF THE INVENTION

It is an object of the invention to provide a filtering arrangement with reduced process dependency of its filter characteristics. It is further an object of the invention to provide a current sensing arrangement comprising such a filtering arrangement. It is also an object of the invention to provide a filtering method with reduced process dependency of the filtering characteristics.

In one embodiment of the invention, a filtering arrangement comprises a reference voltage input and a compensation current arrangement coupled to the reference voltage input and configured to provide a control current at a current output as a function of a voltage at the reference voltage input. The filtering arrangement also comprises a first and a second current source each having a control input coupled to the current output, a first and a second filter input, and a first transistor and a second transistor. The first transistor has a first connection, a second connection and a control connection, where its first connection is coupled to the first current source and its second connection is coupled to the first filter input through a first resistor. The second transistor has a first connection, a second connection and a control connection, where its first connection is coupled to the second current source, its second connection is coupled to the second filter input through a second resistor and its control connection is coupled to its first connection and to the control connection of the first transistor. A capacitive element is coupled between the first connection of the first transistor and the second connection of the second transistor and a filter output is coupled to the first connection of the first transistor.

During operation of the filtering arrangement a reference voltage is applied at the reference voltage input. The compensation current arrangement generates a control current as a function of the reference. The control current generated by the compensation current arrangement is used to control the first and the second current source. In various embodiments the first and the second current source provide equal currents. The current provided from the second current source is used to control the first and the second transistor.

When an input signal is provided at the first and the second filter input it is further passed respectively through a first and a second resistor to the second connection of the first transistor and the second connection of the second transistor. An output signal is then derived by means of the capacitive element and as a function of the currents provided by the current sources and of the input signal. Thereby, process dependency of the filter characteristics is reduced.

In further embodiments of the filtering arrangement the compensation current arrangement is coupled to a constant supply voltage input and the control current is further provided as a function of a voltage at the constant supply voltage input.

The constant supply voltage input provides a stable supply voltage which further improves performance of the compensation current arrangement. The control current is generated in dependence of the voltage at the reference voltage input and in addition in dependence of the voltage, applied at the constant supply voltage input.

The effect of reduced process dependency is achieved through the use of the compensation current arrangement, the reference voltage and the constant supply voltage. The reference voltage is usually an almost or fully process independent voltage.

In various embodiments of the filter arrangement the compensation current arrangement can comprise a reference transistor and a first transistor-based current mirror. The reference transistor is configured to control a reference current as a function of the reference voltage and the constant supply voltage. The first transistor-based current mirror is configured to provide a compensation current as a function of the reference current. The compensation current arrangement in this case is also configured to provide the control current as a function of the compensation current.

In further embodiments of the filtering arrangement the compensation current arrangement can comprise a bias current source which is configured to provide a bias current. The compensation current arrangement in this case is configured to provide the control current also as a function of the bias current, which may also be process independent.

In a further embodiment of the filtering arrangement the first and the second current source can comprise a second and a third transistor-based current mirror. The second and the third transistor-based current mirrors can be used for providing a first and a second current at the respective current output. Both the first and the second current are provided as a function of the control current.

In a further embodiment the capacitive element can comprise a polycapacitor or a field effect transistor, wherein the polycapacitor can be a semiconductor based capacitor. The field effect transistor can be connected as capacitor.

In various embodiments the filtering arrangement can comprise a third transistor. The third transistor can have a first connection coupled to the second connection of the second transistor and a control connection coupled to the filter output. The third transistor is controlled via the signal on the first connection of the first transistor in combination with the signal on the capacitor connection, coupled to the first connection of the first transistor. An output current, controlled by the third transistor and derived as a function of the output signal, is then further passed to the second output of the second transistor.

An exemplary embodiment of a filtering method comprises generating a control current depending on a reference voltage and generating a first and a second current, depending on the control current. The first current is then provided to a first connection of a first transistor and the second current is provided to a first connection of a second transistor. The first and the second transistor are controlled depending on the second current. An input signal is provided to a second input of the first transistor and to a second input of the second transistor. The output signal is derived as a function of the input signal and the first and the second current by means of a capacitive element. The capacitive element is coupled between the first input of the first transistor and the second input of the second transistor.

In a further embodiment of the filtering method a compensation current is generated depending on the reference voltage and the constant supply voltage. The control currents are generated depending on the compensation current.

In various embodiments of the filtering method the control currents can be generated further depending on a bias current.

In a further embodiment the output signal comprises an output current. The output current is controlled by a third transistor depending on a voltage at the first connection of the first transistor.

Furthermore, a current sensing arrangement can be provided comprising a filtering arrangement according to one of the embodiments described above, a current input and an impedance element. The current input can be coupled to the first filter input. The impedance element can be coupled between the first and the second filter input.

During operation of the current sensing arrangement a current passes through the impedance element. The resulting voltage between the first and the second filter input is the input voltage of the filtering arrangement.

BRIEF DESCRIPTION OF THE DRAWINGS

The text below explains the invention in detail using exemplary embodiments with reference to drawings, in which.

DETAILED DESCRIPTION OF THE DRAWINGS

Figure 1:
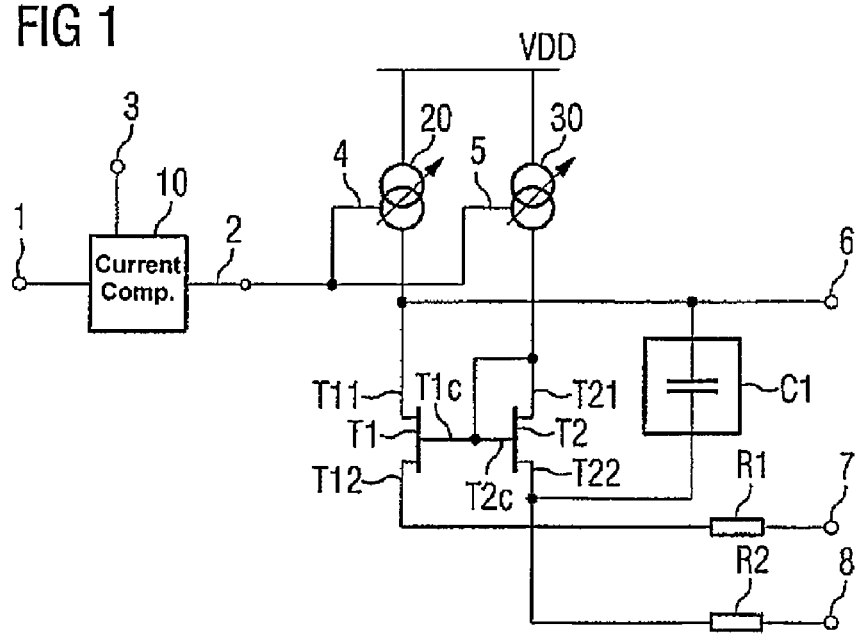
FIG. 1 is a first embodiment of a filtering arrangement.

Like reference numerals designate corresponding similar parts or elements. Elements are not necessarily to scale relative to each other.

FIG. 1 shows an embodiment of a filtering arrangement. The filtering arrangement comprises a reference voltage input 1 and a constant supply voltage input 3 both coupled to a current compensation arrangement 10. The current compensation arrangement 10 has a current output 2 coupled to a control input of a first current source 20 and a control input 5 of a second current source 30. The filtering arrangement further comprises a first transistor T1 and a second transistor T2. The first transistor T1 has a first connection T11 coupled to the first current source 20. The current that is controlled by this transistor can be constant, but the voltage that controls T1 may vary. Accordingly the second transistor T2 has a first connection T21 coupled to the second current source 30. The first transistor T1 and the second transistor T2 have control connections T1c, T2c respectively coupled together to the second current source 30.

A second connection T12 of the first transistor T1 is coupled to a first filter input 7 through a first resistor R1. A second connection T22 of the second transistor T2 is coupled to a second filter input 8 through a second resistor R2. A capacitive element C1 is coupled between the first connection T11 of the first transistor T1 and the second connection T22 of the second transistor T2. The filtering arrangement further comprises a filter output 6 coupled to the first connection T11 of the first transistor T1.

During operation of the filtering arrangement a reference voltage is applied at the reference voltage input 1 and a constant supply voltage is applied at the constant supply voltage input 3. The compensation current arrangement 10 generates a control current at the current output 2 as a function of the reference voltage and the constant supply voltage. A first current from the first current source 20 and a second current from the second current source 30 are then generated as a function of the control voltage. The first transistor T1 and the second transistor T2 are controlled as a function of the second current.

When an input signal is applied at the first filter input 7 and the second filter input 8 it is further passed through the first resistor R1 and through the second resistor R2 respectively and to the second connection T12 of the first transistor and the second connection T22 of the second transistor T2 respectively. An output signal is derived by means of the capacitive element C1 at the filter output 6 as a function of the input signal and the first and the second current.

In an exemplary embodiment the first current I1 and the second current I2 can be equal. Thus the transistors T1 and T2 can be matched and can have equal gate to source voltage.

The low-pass cutoff frequency Fc of the filtering arrangement can be expressed with the formula:

$$F_c = \frac{1}{(2\pi RC)}$$

where R=Rds+2R1, Rds is the AC resistance between the source and the drain of the first transistor T1, R1 is the resistance of the first resistor R1 and C is the capacitance of the capacitive element C1. If Rds is bigger than R1, for example by at least one order, then R is dominated by Rds. Rds is minimum when the compensation current is maximum and vice versa. Because of parameter variations like temperature changes inside the filtering arrangement the values for Rds may vary. To this end the compensation current arrangement 10 generates a compensation current that has opposite variations compared to the variations for Rds. Thus the effect of compensation reduces the variations of Rds and makes the cutoff frequency fully or nearly process independent. Rds can be increased with the decrease of I1 and vice versa.

Figure 2:
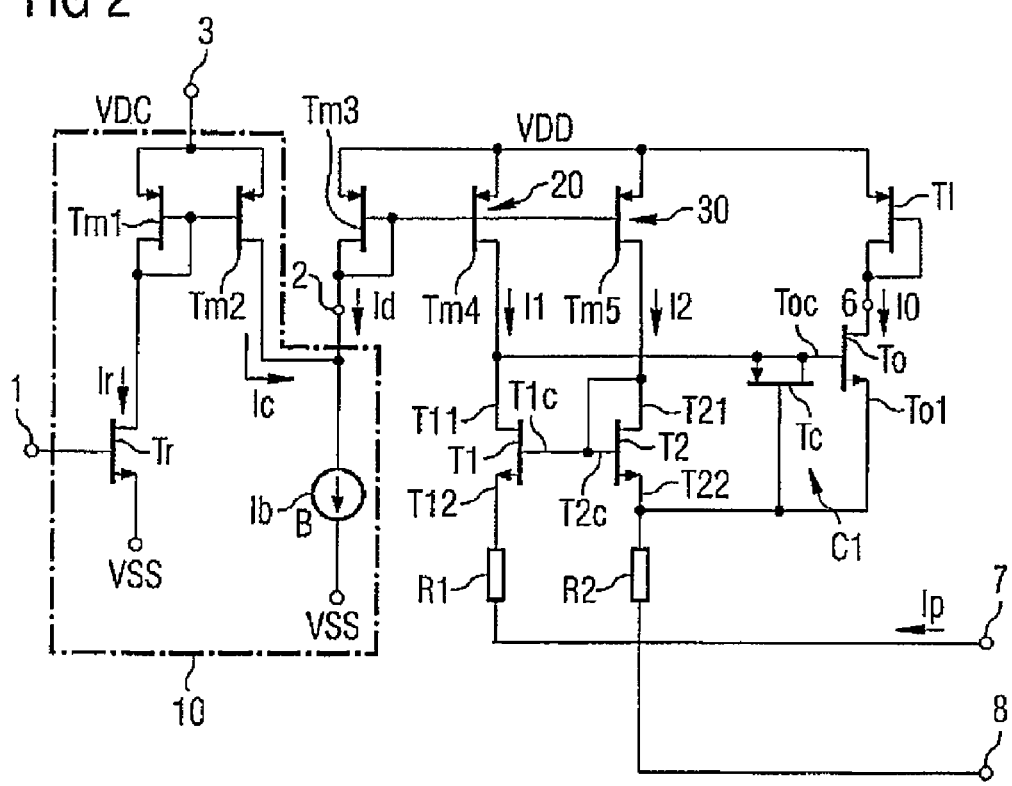
FIG. 2 is a second embodiment of a filtering arrangement.

FIG. 2 shows another embodiment of a filtering arrangement. Additionally to the elements and functions described in FIG. 1 the compensation current arrangement 10 comprises a reference transistor Tr which is coupled to the voltage input 1.

The reference transistor Tr is also coupled to a first transistor based current mirror comprising a transistor Tm1 and a transistor Tm2. The transistor mirror is coupled to the constant supply voltage input 3. The reference voltage at Tr can be constant, but the current, controlled by the transistor may vary. Tr can be configured to operate in its linear region. The compensation current arrangement 10 further comprises a bias current source B coupled to the transistor based current mirror. The compensation current arrangement 10 is coupled to a first current source 20 and a second current source 30 whereas the first current source 20 comprises two transistors Tm3, Tm4, which also form a transistor based current mirror. The second current source 30 comprises two transistors, the transistor Tm3, common for the first current source, and an additional transistor Tm5 also forming a transistor based current mirror. The transistors Tm4 and Tm5 can be dimensioned in such way that their drain to source resistance is bigger than the drain to source resistance of T1 for example by at least one order. The filtering arrangement further comprises a transistor Tc used as a capacitive element. The filter output 6 is coupled to the control connection Toc of an output transistor To. The first connection To1 of the output transistor Toc is coupled to the second connection T22 of the second transistor T2.

During operation of the filtering arrangement a respective voltage is applied at both the reference voltage input 1 and at the constant supply voltage input 3. As described in the previous embodiment the reference current Ir is controlled by the reference transistor Tr as a function of the reference voltage and the constant supply voltage. The transistor based mirror comprising the transistors Tm1, Tm2 provides a compensation current Ic in dependence of the reference current Ir. A control current Id is derived at the compensation current arrangement 10 current output 2 as a function of this compensation current Ic and the bias current Ib:

$$I_d = I_b - I_c = I_b - KI_r = I_b - \frac{K(V_{dc} - V_{th})}{R_{ds}}$$

where K is a constant, representing the ratio between the width to length values of the channels of the transistors Tm1 and Tm2, Vth is the threshold voltage of the transistor Tm1 and Vdc is the supply voltage, applied at the constant supply voltage input. The control current further controls the first current source 20 and the second current source 30. A first and a second current are generated as a function of the control current by the first current source 20 and the second current source 30 respectively. The output transistor To, coupled to the filter output 6, converts the signal at its control connection Toc into an output current Io.

A first load transistor Tl is coupled to the second connection of the output transistor To. The first load transistor can also be replaced by another resistive element like a resistor. In other embodiments of the filtering arrangement a plurality of load transistors may be present. These transistors can be coupled in parallel for example as current mirrors to the load transistor T1. The rest of the elements on FIG. 2 function as already described in the previous embodiment.

As already described in the embodiment of FIG. 1, the low-pass cutoff frequency is obtained according to the formula:

$$F_c = \frac{1}{(2\pi RC)}$$

In the embodiment of FIG. 1C is the capacitance of the capacitor C1. If a transistor Tc is used as capacitive element as shown on FIG. 2, then its capacitance is presented as the capacitance Cgs between its gate and its source. So the capacitance C can be expressed as C=Cgs+Cogs, where Cogs is the capacitance of the output transistor To. If Cgs is bigger that than Cogs, for example by at least one order, the low-pass cutoff frequency can be obtained from the following equation:

$$F_c = \frac{1}{(2\pi R_{ds}C_{gs})}$$

Since Cgs also depends on process variations, the compensation current, generated by the compensation current arrangement compensates not only Rds but the whole product Rds*Cgs, making it process invariable and thus making the cutoff frequency process independent. Rds and Cgs can have different percentage of variation. Rds has minimum value when the value of Cgs is maximum. The compensation also can reduce the time required to settle the output current Io. Because of the effect of compensation the control bandwidth of the filtering arrangement is increased, the current sense delay is decreased and the latch ups are reduced. This also allows increased duty cycle of operation of the filtering arrangement.

In an exemplary embodiment of the filtering arrangement the size of the capacitive element can be reduced. This can enable the integration of the filtering arrangement on-chip.

In further embodiment of the filtering arrangement the optimal cutoff frequency can be selected when Rds is maximum. If Rds has a minimum value Rds (min) and the compensation current is equal to zero than the cutoff frequency will be moved to the optimal cutoff frequency.

Figure 3:
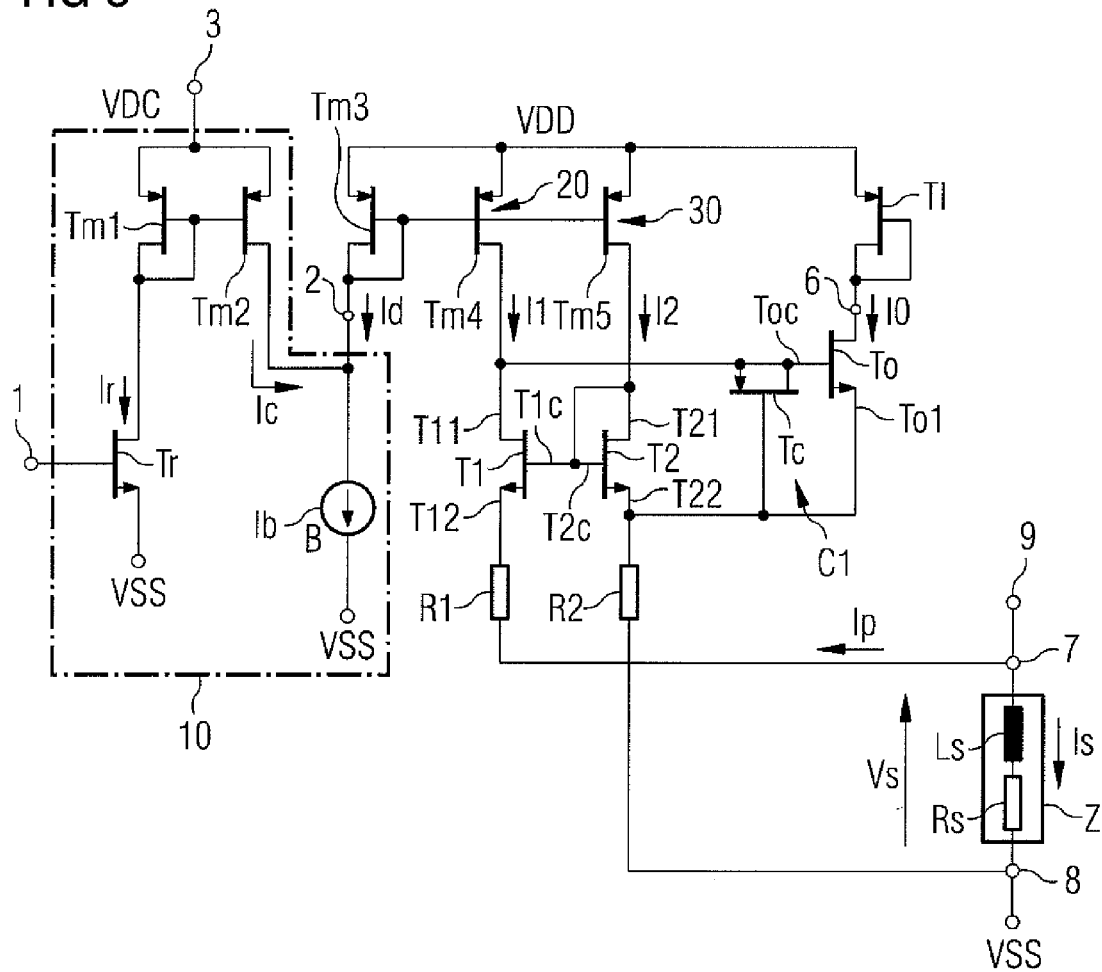
FIG. 3 is an embodiment of a current sensing arrangement.

FIG. 3 shows an embodiment of a current sensing arrangement. The current sensing arrangement comprises a filtering arrangement according to one of the embodiments described above and an impedance element that is coupled between the first filter input 7 and the second filter input 8. A current input 9 is coupled to the first filter input 7. The impedance element for example comprises a capacitive element Rs and an inductive element Ls.

According to the embodiment described in FIG. 3 an input current Is is applied at the current input 9. This current further passes through the first filter input 7, the impedance element Z and the second filter input 8. The resulting voltage difference between the first filter input 7 and the second filter input 8 is the input voltage Vs. The voltage Vs can be equal to the drop across R2, caused by The current Io. The output current Io can be expressed as a function of the input voltage Vs according to the equation:

$$I_o = \frac{V_s}{R2}$$

The input current Is can be a pulse current. Therefore it can cause peak overshoots Ipk in the voltage Vs proportional to the value of the inductive element Ls. The value of the peak overshoots can be expressed with the formula:

$$I_{pk} = \frac{L_s \partial I_s}{\partial t}$$

The filtering arrangement can better suppress these peak overshoots through the use of the compensation. The output voltage is the voltage difference that exists between the gate and the source of the load transistor T1. Since Is can have a value much larger than Ip, the voltage Vs not affected by Ip.

In various embodiments Rs can have a small value and the inductive element Ls can be the internal inductance of the Rs. The transistors T1, T2, To and Tr can be NMOS transistors and the transistor Tc can be a PMOS transistor. Also the transistors T1, T2 and To can be matched trough the currents I1 and I2, which can be equal. The reference voltage at the reference voltage input 1 can be an analog voltage and the compensation current Ic can obtain values from zero to I1.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A filtering arrangement comprising:
   a reference voltage input;
   a first and a second current source each having a control input coupled to the current output;
   a first and a second filter input;
   a first transistor with a first connection, a second connection and a control connection, where its first connection is coupled to the first current source and its second connection is coupled to the first filter input through a first resistor;
   a second transistor with a first connection, a second connection and a control connection, where its first connection is coupled to the second current source, its second connection is coupled to the second filter input through a second resistor and its control connection is coupled to its first connection and to the control connection of the first transistor;
   a compensation current arrangement coupled to the reference voltage input and configured to provide a control current at a current output as a function of a voltage at the reference voltage input and as a function of a compensation current having opposite variations in value in comparison to variations in value of a product of a resistance between the first and second connections of the first transistor and a capacitance of the capacitive element;
   a capacitive element coupled between the first connection of the first transistor and the second connection of the second transistor; and
   a filter output coupled to the first connection of the first transistor.

2. The filtering arrangement according to claim 1, wherein the compensation current arrangement is coupled to a constant supply voltage input and the control current is further provided as a function of a voltage at the constant supply voltage input.

3. The filtering arrangement according to claim 2, wherein the compensation current arrangement comprises:
   a reference transistor configured to control a reference current as a function of the voltage at the reference voltage input and the voltage at the constant supply voltage input;
   a first transistor-based current minor configured to provide the compensation current as a function of the reference current; and
   wherein the compensation current arrangement is configured to provide the control current as a function of the compensation current.

4. The filtering arrangement according to claim 3, wherein the compensation current arrangement comprises a bias current source configured to provide a bias current and wherein the compensation current arrangement is configured to provide the control current as a function of the bias current.

5. The filtering arrangement according to claim 4, wherein the first and the second current source comprise a second and a third transistor-based current mirror respectively for providing a first and a second current as a function of the control current.

6. The filtering arrangement according to claim 1, wherein the capacitive element comprises a polycapacitor or a field effect transistor, connected as a capacitor.

7. The filtering arrangement according to claim 1, comprising a third transistor with a first connection coupled to the second connection of the second transistor and a control connection coupled to the filter output.

8. A current sensing arrangement comprising:
   a filtering arrangement according to claim 1;
   a current input coupled to the first filter input; and
   an impedance element coupled between the first and the second filter input.

9. A filtering method comprising the steps of:
   generating a control current dependent on a supplied reference voltage and dependent on a compensation current;
   generating a first and a second current, dependent on the control current;
   providing the first current to a first connection of a first transistor;
   providing the second current to a first connection of a second transistor;
   controlling the first and the second transistors dependent on the second current;
   providing an input signal to a second connection of the first transistor and to a second connection of the second transistor; and
   deriving an output signal as a function of the input signal and the first and the second currents by a capacitive element coupled between the first connection of the first transistor and the second connection of the second transistor;
   the compensation current having opposite variations in value in comparison to variations in value of a product of a resistance between the first and second connections of the first transistor and a capacitance of the capacitive element.

10. The filtering method according to claim 9, wherein the compensation current is generated dependent on the supplied reference voltage and the constant supply voltage.

11. The filtering method according to claim 10, wherein the control current is generated further dependent on a bias current.

12. The filtering method according to claim 9, wherein the output signal comprises an output current, which is controlled by a third transistor dependent on a voltage at the first connection of the first transistor.

13. A filtering arrangement comprising:
   a reference voltage input;
   a first and a second current source each having a control input coupled to the current output;
   a first and a second filter input;
   a first transistor with a first connection, a second connection and a control connection, where its first connection is coupled to the first current source and its second connection is coupled to the first filter input through a first resistor;
   a second transistor with a first connection, a second connection and a control connection, where its first connection is coupled to the second current source, its second connection is coupled to the second filter input through a second resistor and its control connection is coupled to its first connection and to the control connection of the first transistor;

a compensation current arrangement coupled to the reference voltage input and configured to provide a control current at a current output as a function of a voltage at the reference voltage input and as a function of a compensation current having opposite variations in value in comparison to variations in value of a resistance between the first and second connections of the first transistor;

a third transistor coupled between the first connection of the first transistor and the second connection of the second transistor;

a filter output coupled to the first connection of the first transistor; and an output transistor coupled to the filter output.

* * * * *